(12) United States Patent
Kamei

(10) Patent No.: US 10,225,929 B2
(45) Date of Patent: Mar. 5, 2019

(54) CERAMIC CIRCUIT BOARD AND ELECTRONIC DEVICE

(71) Applicant: KYOCERA Corporation, Kyoto-shi, Kyoto (JP)

(72) Inventor: Takafumi Kamei, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 15/870,413

(22) Filed: Jan. 12, 2018

(65) Prior Publication Data

US 2018/0213640 A1      Jul. 26, 2018

(30) Foreign Application Priority Data

Jan. 25, 2017   (JP) ................. 2017-011649

(51) Int. Cl.
| | | |
|---|---|---|
| H05K 7/00 | (2006.01) | |
| H05K 7/12 | (2006.01) | |
| H05K 1/03 | (2006.01) | |
| H05K 1/09 | (2006.01) | |
| H05K 1/11 | (2006.01) | |
| H05K 1/18 | (2006.01) | |
| H05K 3/12 | (2006.01) | |
| H05K 1/02 | (2006.01) | |
| H05K 3/00 | (2006.01) | |
| H05K 3/10 | (2006.01) | |
| H05K 3/46 | (2006.01) | |
| H05K 1/14 | (2006.01) | |

(52) U.S. Cl.
CPC ............. *H05K 1/0306* (2013.01); *H05K 1/09* (2013.01); *H05K 1/111* (2013.01); *H05K 1/115* (2013.01); *H05K 1/181* (2013.01); *H05K 1/0237* (2013.01); *H05K 1/144* (2013.01); *H05K 3/0014* (2013.01); *H05K 3/102* (2013.01); *H05K 3/1291* (2013.01); *H05K 3/4644* (2013.01); *H05K 2201/041* (2013.01)

(58) Field of Classification Search
CPC ...... H05K 1/0237; H05K 1/0306; H05K 1/09; H05K 1/111; H05K 1/115; H05K 1/144; H05K 1/181; H05K 2201/041; H05K 3/0014; H05K 3/102; H05K 3/1291; H05K 3/4644

See application file for complete search history.

(56) References Cited

U.S. PATENT DOCUMENTS 5,229,213 A     7/1993   Horiuchi et al.
5,928,769 A *   7/1999   Monma .................. B32B 15/01
                                                        174/257

(Continued)

FOREIGN PATENT DOCUMENTS

JP       02-197189 A      8/1990

*Primary Examiner* — Yuriy Semenenko
(74) *Attorney, Agent, or Firm* — Volpe and Koenig, P.C.

(57) ABSTRACT

A ceramic circuit board includes an insulating substrate composed of stacked insulating layers of an alumina-based sintered body, internal leads containing Cu embedded in the insulating substrate, and one or a plurality of metal layers containing Cu embedded in the insulating substrate, at least one of the metal layers being located nearer than the internal leads to the surface of the insulating substrate in the stacking direction, wherein at least part of the metal layer overlaps the internal leads in plan view.

12 Claims, 14 Drawing Sheets

(56) References Cited

U.S. PATENT DOCUMENTS

| | | | | |
|---|---|---|---|---|
| 6,483,714 | B1* | 11/2002 | Kabumoto | H01L 23/49822 |
| | | | | 174/250 |
| 2002/0105083 | A1* | 8/2002 | Sun | H01L 21/486 |
| | | | | 257/758 |
| 2005/0236180 | A1* | 10/2005 | Sarma | H01L 23/15 |
| | | | | 174/256 |
| 2006/0092079 | A1* | 5/2006 | de Rochemont | H01Q 1/362 |
| | | | | 343/700 MS |
| 2008/0224816 | A1* | 9/2008 | Inoue | H01C 7/10 |
| | | | | 338/21 |
| 2013/0026636 | A1* | 1/2013 | Tani | H01L 23/49822 |
| | | | | 257/762 |

* cited by examiner

CERAMIC CIRCUIT BOARD AND ELECTRONIC DEVICE

BACKGROUND OF THE INVENTION

1. Field of the Invention

The present invention relates to a ceramic circuit board for the purpose of mounting electronic components, for example, semiconductor elements or light-emitting elements, thereon and an electronic device.

2. Description of the Related Art

To date, a ceramic insulating base member, for example, an aluminum-oxide-based sintered body (alumina ceramic), has been used for a circuit board provided with electronic components and incorporated into an electronic device. When the material for forming the insulating base member is a ceramic material, such as the above-described alumina ceramic, having a high sintering temperature, a metal material containing a high-melting-point metal material may be used as the material for forming a conductor layer of the circuit board for the purpose of performing co-firing with the insulating base member. For example, when the material for forming the insulating base member is an aluminum-oxide-based sintered body, copper tungsten (CuW) may be used as the material for forming the conductor layer. Japanese Unexamined Patent Application Publication No. 2-197189 discloses that copper tungsten (CuW) is used as the material for forming the conductor layer when the insulating base member is aluminum nitride ceramic.

SUMMARY OF THE INVENTION

A ceramic circuit board according to the present disclosure includes an insulating substrate composed of stacked insulating layers of an alumina-based sintered body, internal leads containing Cu embedded in the insulating substrate, and one or a plurality of metal layers containing Cu embedded in the insulating substrate, at least one of the metal layers being located nearer than the internal leads to the surface of the insulating substrate in the stacking direction, wherein at least part of the metal layer overlaps the internal leads in plan view.

An electronic device according to the present disclosure includes the above-described ceramic circuit board and an electronic component mounted on the ceramic circuit board.

DESCRIPTION OF THE PREFERRED EMBODIMENTS

Figure 1:
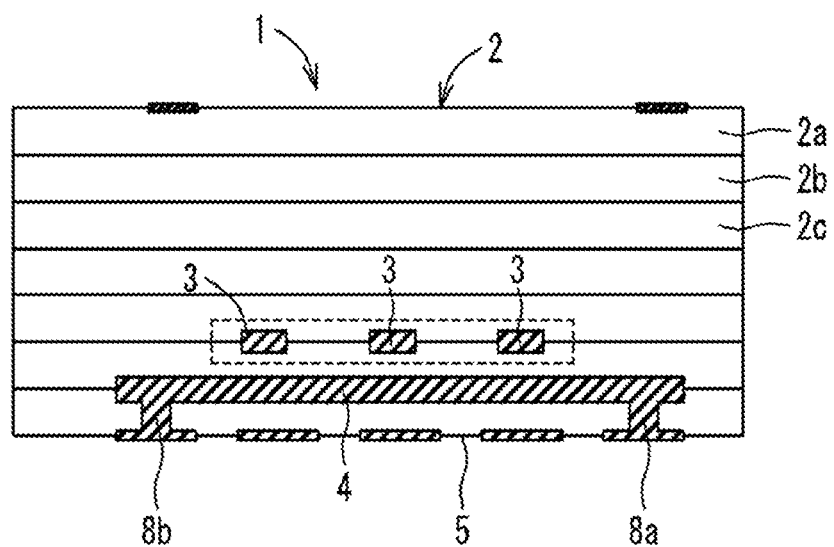
FIG. 1 is a vertical sectional view showing the internal configuration of a ceramic circuit board according to a first embodiment.
Figure 2:
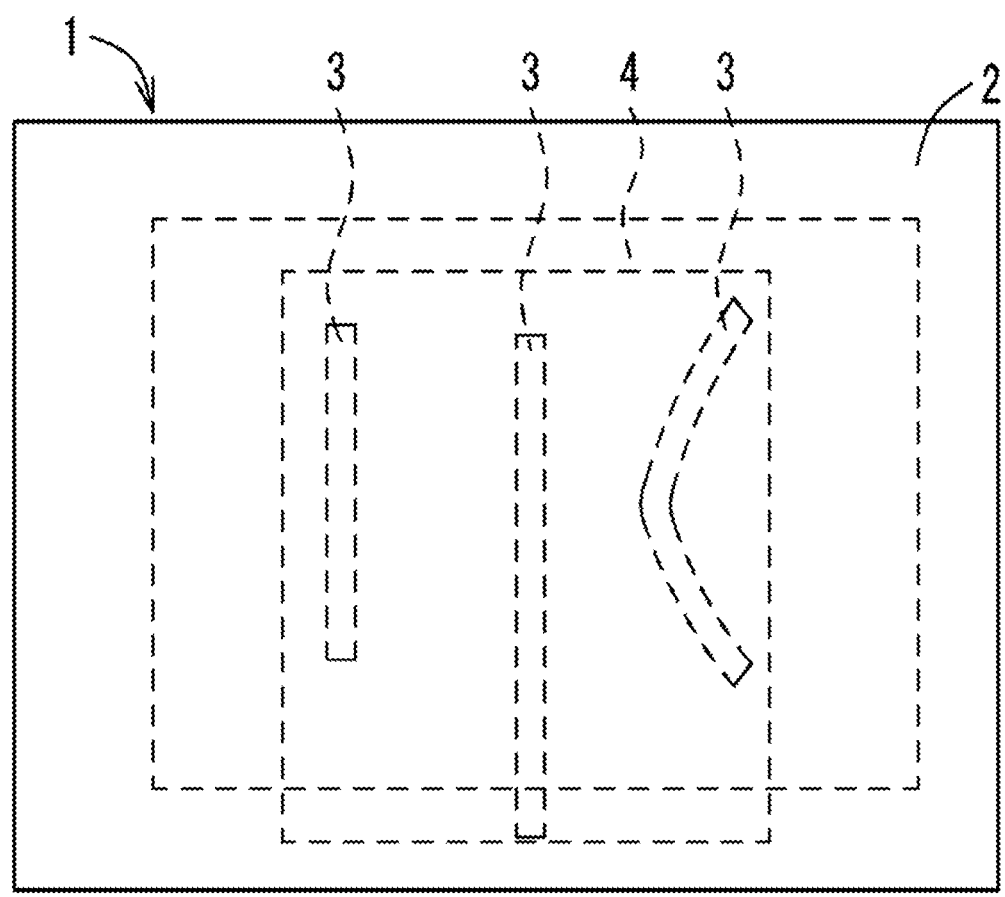
FIG. 2 is a plan view of the ceramic circuit board according to the first embodiment.

FIG. 1 is a vertical sectional view showing the internal configuration of a ceramic circuit board 1 according to a first embodiment. FIG. 2 is a plan view of the ceramic circuit board 1. The ceramic circuit board (hereafter referred to as a circuit board) 1 includes an insulating substrate 2, internal leads 3, and a metal layer 4. The internal leads 3 are embedded between layers inside the insulating substrate 2 in which a plurality of insulating layers 2a, 2b, 2c, and the like composed of an alumina-based sintered body is stacked. The metal layer 4 contains Cu as does the internal leads 3, and at least one metal layer 4 is embedded in the insulating substrate 2 nearer than the internal leads 3 to the surface 5 of the insulating substrate 2 in the stacking direction. The surface 5 may be any one of two surfaces in the stacking direction. A ground layer (earth) may be disposed between layers inside the insulating substrate 2 because of favorable high-frequency characteristics.

As described above, the insulating substrate 2 includes the plurality of insulating layers 2a, 2b, 2c, and the like composed of the alumina-based sintered body in which the primary crystal is alumina. In each of the insulating layers 2a, 2b, 2c, and the like, the proportion of alumina is 85 to 95 percent by mass, and alumina is present as granular or columnar crystals. When the proportion of alumina is 85 to 95 percent by mass, the insulating substrate 2 is densified during co-firing of the internal leads 3 and the metal layer 4, each having a composition described later.

The insulating substrate 2 is produced by adding an appropriate organic binder, solvent, and the like to a raw material powder of aluminum oxide, silicon oxide, magnesium oxide, calcium oxide, and the like, performing mixing so as to form a slurry, forming the resulting slurry into the shape of a sheet by a known doctor blade method, calender roll method, or the like so as to produce ceramic green sheets, subjecting the plurality of ceramic green sheets to appropriate punching, performing stacking, and performing firing at a high temperature (about 1,300° C. to 1,400° C.)

The internal leads 3 are produced by metallization that uses a metal powder containing CuW as a primary component. The metal powder may be in the form of a mixture or an alloy. For example, the internal leads 3 are produced by adding an organic binder, an organic solvent, a dispersing agent, and the like as necessary to a metal powder of W and a metal powder of Cu. The internal leads are, for example, power supply leads.

The metal layer 4 is produced in the same manner as the internal leads 3 by adding an organic binder and an organic solvent to a metal powder of W and a metal powder of Cu.

For example, as shown in FIG. 1, the metal layer 4 is embedded nearer than the internal leads 3 to the surface 5 of the insulating substrate 2, and as shown in FIG. 2, at least part of the metal layer 4 overlaps the internal leads in plan view. In this regard, the metal layer 4 may include a portion not containing a conductor, and the size of the portion in which the metal layer 4 does not overlap the internal leads 3 is preferably 100 µm or less. When the metal layer 4 is disposed as a mesh, the size of the mesh in which the metal layer 4 does not overlap the internal leads is preferably 100 µm or less.

For example, the metal layer 4 located nearer than the internal leads 3 to the surface 5 is heated during firing due to the heat transferred into the insulating substrate 2 from the surface 5 side and, thereafter, the internal leads 3 are heated. Diffusion of Cu from the internal leads 3 into the insulating substrate 2 is started in the state in which the metal layer 4 is heated and diffusion of Cu from the metal layer 4 into the insulating substrate 2 proceeds. Therefore, a region in the insulating substrate 2 into which Cu in the internal leads 3 can diffuse is limited. Diffusion in the stacking direction of Cu from the internal leads 3 becomes difficult, and diffusion of Cu from the internal leads 3 is suppressed. Consequently, an increase in the electrical resistance of the internal leads 3 due to a reduction in the amount of Cu in the internal leads 3 can be suppressed.

Figure 3:
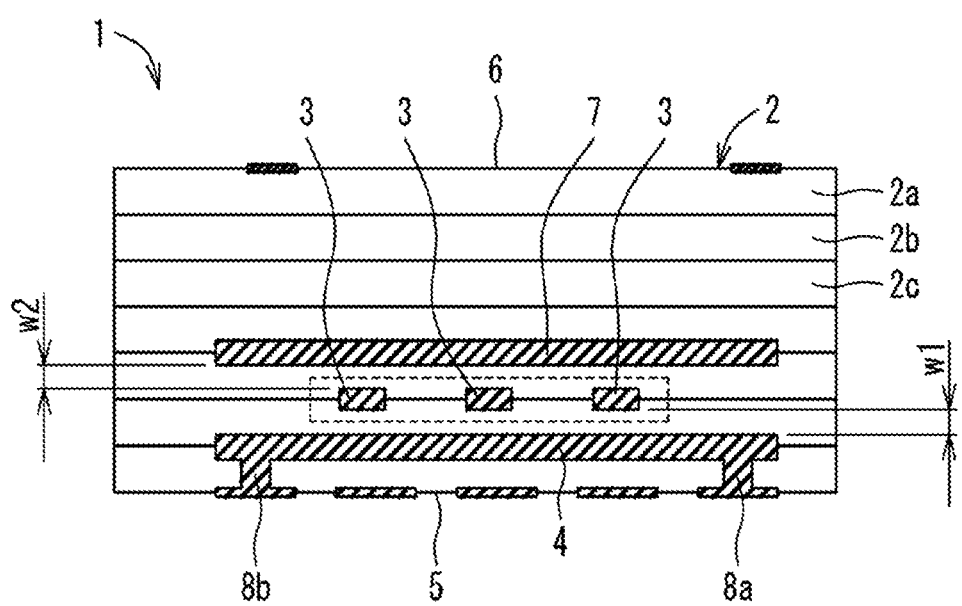
FIG. 3 is a vertical sectional view showing the internal configuration of a ceramic circuit board according to a second embodiment.
Figure 4:
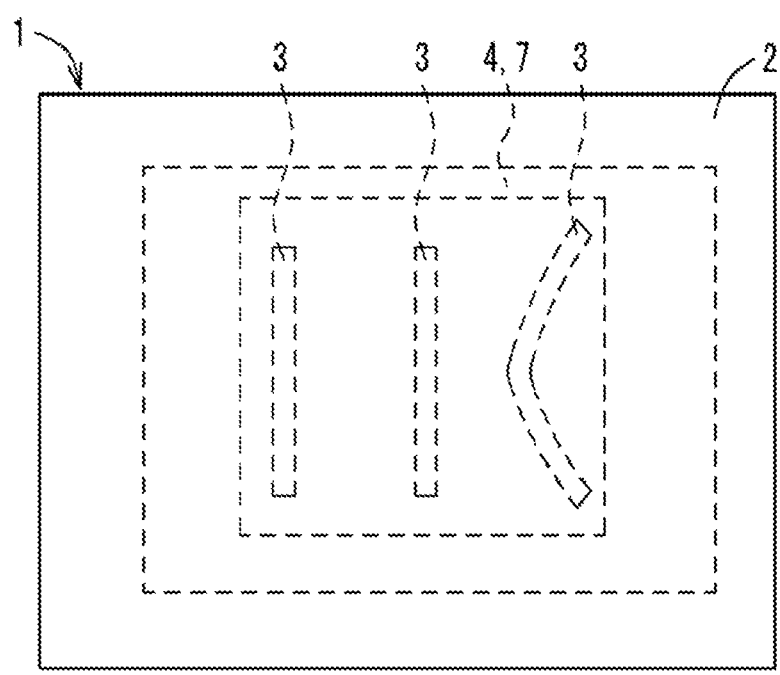
FIG. 4 is a plan view of the ceramic circuit board according to the second embodiment.

FIG. 3 is a vertical sectional view showing the internal configuration of a circuit board 1 according to a second embodiment. FIG. 4 is a plan view of the circuit board 1. The same elements as those in the first embodiment are indicated by the same reference numerals as those set forth above and explanations thereof are not repeated.

In the circuit board 1 according to the first embodiment, the metal layer 4 is embedded nearer than the internal leads 3 to the surface 5. However, in the circuit board 1 according to the present embodiment, a metal layer 7 is embedded nearer than the internal leads 3 to the other surface, which is surface 6, and the two metal layers 4 and 7, among the metal layers, are disposed so as to interpose the internal leads 3 therebetween.

For example, the heat transferred to the insulating substrate 2 during firing is also transferred to the insulating substrate 2 from the surface 6 side, the metal layer 7 is heated and, thereafter, the internal leads 3 are heated. Diffusion of Cu from the internal leads 3 into the insulating substrate 2 is started in the state in which the metal layers 4 and 7 are heated prior to the internal leads 3 and diffusion of Cu from the metal layers 4 and 7 into the insulating substrate 2 proceeds. Therefore, a region in the insulating substrate 2, into which Cu in the internal leads 3 can diffuse, is further limited. Diffusion of Cu from the internal leads 3 in the stacking direction becomes more difficult, and diffusion of Cu from the internal leads 3 is suppressed. Consequently, an increase in the electrical resistance of the internal leads 3 due to a reduction in the amount of Cu in the internal leads 3 can be further suppressed.

It is preferable that the distance w1 from the internal leads 3 to the metal layer 4 on the surface 5 side be equal to the distance w2 from the internal leads 3 to the metal layer 7 on the surface 6 side. When the distance from the internal leads 3 to the metal layer 4 is different from the distance from the internal leads 3 to the metal layer 7, a difference between the amount of Cu that diffuses from the metal layer 4 and the amount of Cu that diffuses from the metal layer 7 increases, and distortion and warping of the insulating substrate 2 may easily occur.

Figure 5:
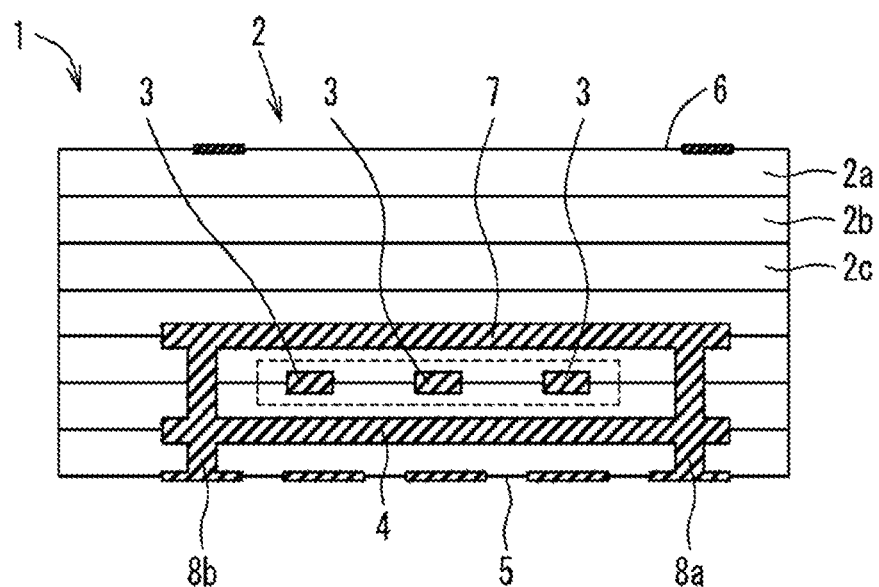
FIG. 5 is a vertical sectional view showing the internal configuration of a ceramic circuit board according to a third embodiment.
Figure 6:
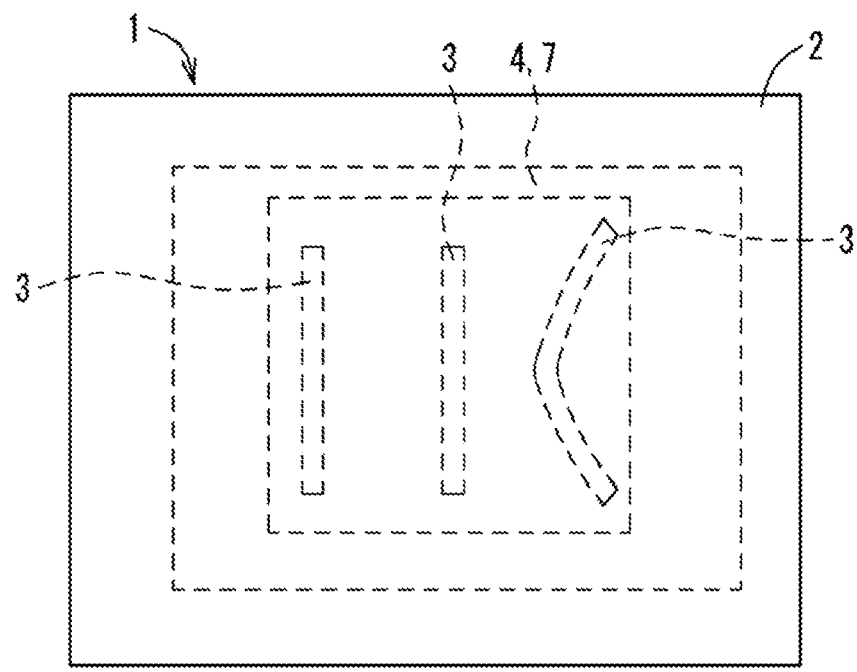
FIG. 6 is a plan view of the ceramic circuit board according to the third embodiment.

FIG. 5 is a vertical sectional view showing the internal configuration of a circuit board 1 according to a third embodiment. FIG. 6 is a plan view of the circuit board 1. The same elements as those in the first embodiment or the second embodiment are indicated by the same reference numerals as those set forth above and explanations thereof are not repeated.

In the present embodiment, through conductors 8a and 8b are provided. The through conductors 8a and 8b are produced in the same manner as the metal layers 4 and 7 by metallization that uses a metal powder containing CuW as a primary component. The metal powder may be in the form of a mixture or an alloy. For example, the through conductors 8a and 8b are produced by adding an organic binder, an organic solvent, a dispersing agent, and the like as necessary to a metal powder of W and a metal powder of Cu.

The through conductors are disposed at, for example, two locations indicated by through conductors 8a and 8b and are embedded in the insulating substrate 2. The through conductors pass through the insulating layers in the stacking direction of the insulating layers and are connected to the metal layers 4 and 7 while one end portion faces the surface 5. Each of the through conductors 8a and 8b is connected to the metal layer 4 on the surface 5 side and to the metal layer 7 on the surface 6 side while passing through the metal layer 4 on the surface 5 side and being connected to the metal layer 7 on the surface 6 side.

For example, the heat transferred from the surface 5 side during firing is transferred to the metal layers 4 and 7 from the surface 5 side through the through conductors 8a and 8b, which exhibit good heat conduction. The heat resulting from firing can be promptly and efficiently transferred while lowering of temperature is suppressed compared with heat transfer to the metal layers 4 and 7 through the insulating substrate 2. Consequently, Cu can effectively diffuse from the metal layers 4 and 7.

When the internal leads 3 are interposed between the metal layer 4 on the surface 5 side and the metal layer 7 on the surface 6 side, the heat can be transferred through the through conductors 8a and 8b to both the metal layer 4 on the surface 5 side and the metal layer 7 on the surface 6 side while lowering of temperature is suppressed. Therefore, a difference between the amount of Cu that diffuses from the metal layer 4 on the surface 5 side and the amount of Cu that diffuses from the metal layer 7 on the surface 6 side can be decreased and, thereby, distortion and warping of ceramic due to a difference in the amount of Cu diffusion can be suppressed.

Figure 7:
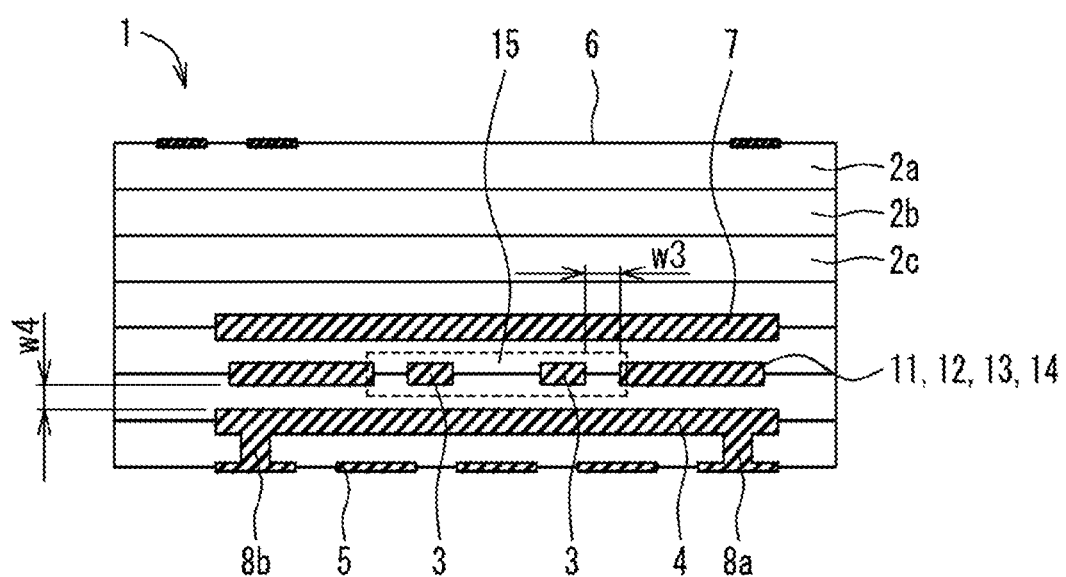
FIG. 7 is a vertical sectional view showing the internal configuration of a ceramic circuit board according to a fourth embodiment.
Figure 8:
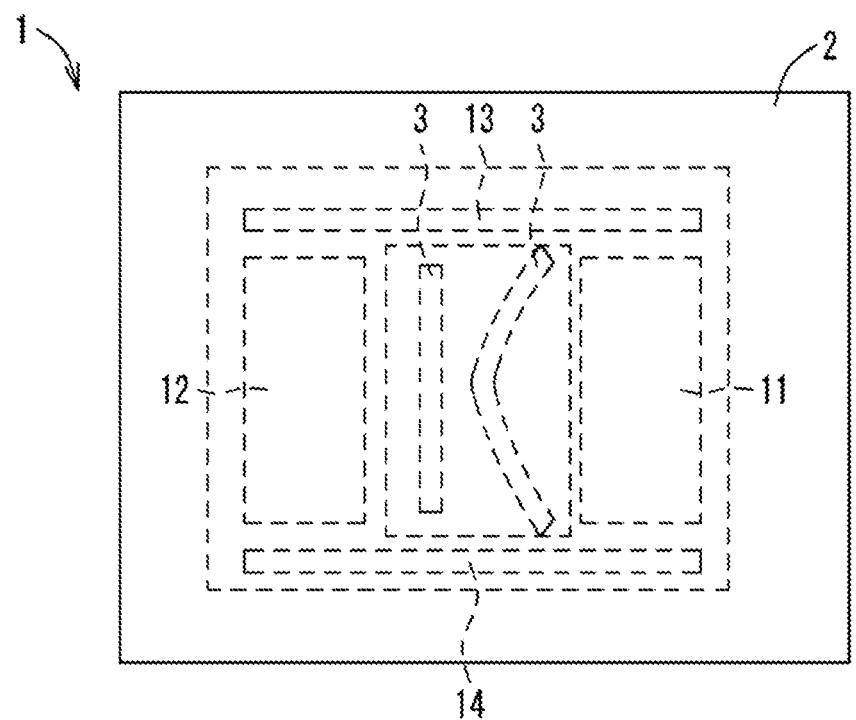
FIG. 8 is a plan view showing the layout of metal layers according to the fourth embodiment.
Figure 9:
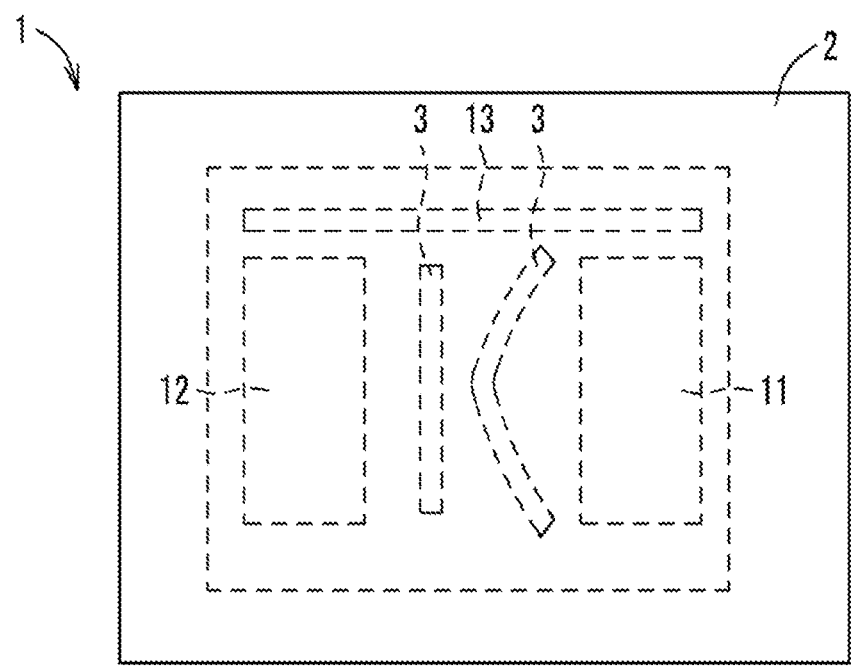
FIG. 9 is a plan view showing the layout in another example of metal layers according to the fourth embodiment.
Figure 10:
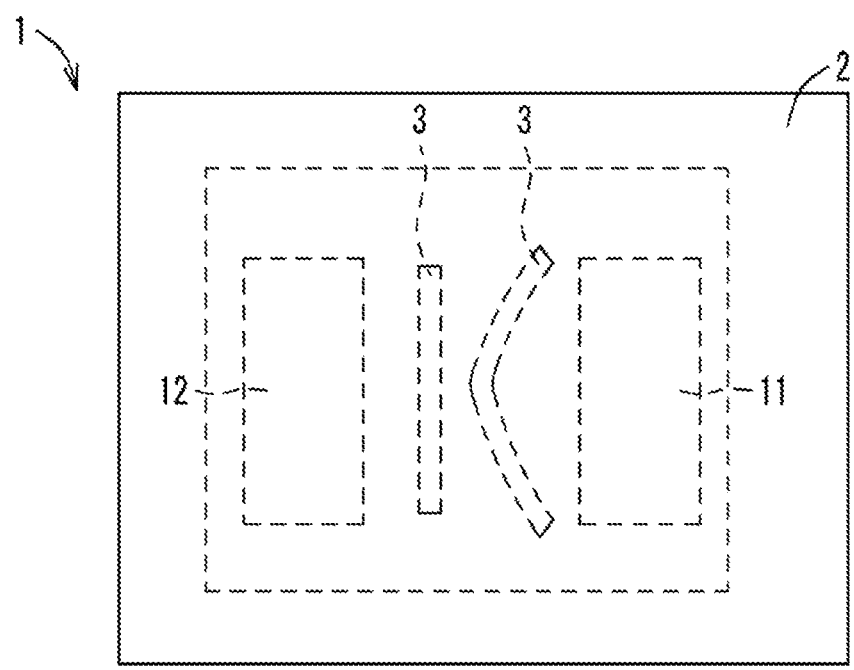
FIG. 10 is a plan view showing the layout in another example of metal layers according to the fourth embodiment.

FIG. 7 is a vertical sectional view showing the internal configuration of a circuit board 1 according to a fourth embodiment. FIG. 8 to FIG. 10 are plan views showing the layout of metal layers. The same elements as those in the first embodiment to the third embodiment are indicated by the same reference numerals as those set forth above and explanations thereof are not repeated. In the present embodiment, metal layers 11, 12, 13, and 14 adjacent to the internal leads 3 are further disposed in the direction orthogonal to the stacking direction of the insulating layers.

For example, the internal leads 3 and the metal layers 11, 12, 13, and 14 are heated almost at the same time due to the heat transferred from the surface 5 side during firing. Diffusion of Cu from the internal leads 3 in the direction orthogonal to the stacking direction becomes difficult due to diffusion of Cu from the metal layers 11, 12, 13, and 14 in the direction orthogonal to the stacking direction, and further diffusion of Cu from the internal leads 3 in the direction orthogonal to the stacking direction can be suppressed.

FIG. 8 is a plan view in which metal layers 11, 12, 13, and 14 are disposed around the internal leads 3 on four sides, and FIG. 9 is a plan view in which metal layers 11, 12, and 13 are disposed around the internal leads 3 on three sides. FIG. 10 is a plan view in which metal layers 11 and 12 are disposed around the internal leads 3 on two sides. As shown in FIG. 8, when the metal layers 11, 12, 13, and 14 are disposed around the internal leads 3 on four sides, diffusion of Cu from the internal leads 3 in all directions orthogonal to the stacking direction can be suppressed. When the amount of diffusion in the stacking direction of Cu from the internal leads 3 is low, the metal layers 11, 12, and 13 can be disposed around the internal leads 3 on three sides, as shown in FIG. 9, or the metal layers 11 and 12 can be disposed around the internal leads 3 on two sides, as shown in FIG. 10.

When a plurality of internal leads 3 is disposed in the direction orthogonal to the stacking direction, a metal layer may be disposed at a location 15 between the adjacent internal leads 3.

In order to even out the amounts of Cu diffusion from the metal layers 11, 12, 13, and 14 and suppress distortion and warping of the ceramic, it is preferable that the distance w3 between the internal leads 3 and the metal layer in the direction orthogonal to the stacking direction be made equal to the distance w4 between the internal leads 3 and the metal layer in the stacking direction.

Figure 11:
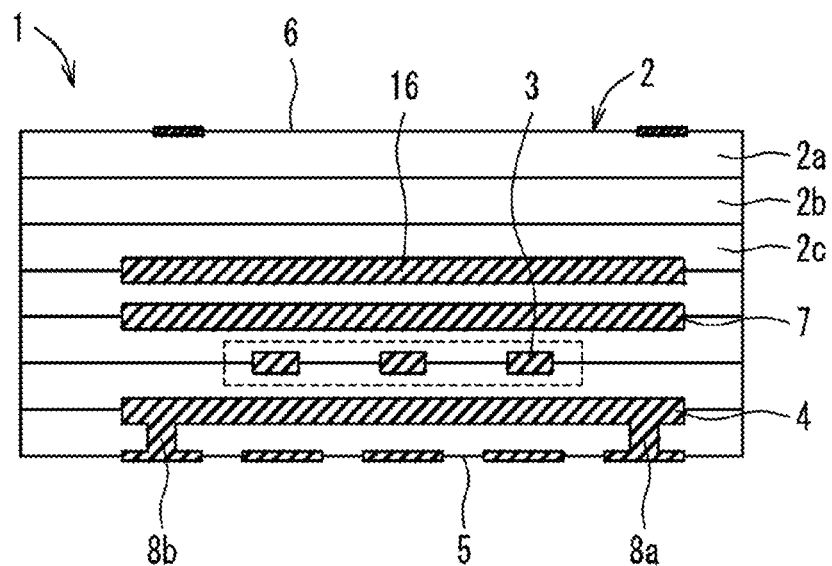
FIG. 11 is a vertical sectional view showing the internal configuration of a ceramic circuit board according to a fifth embodiment.
Figure 12:
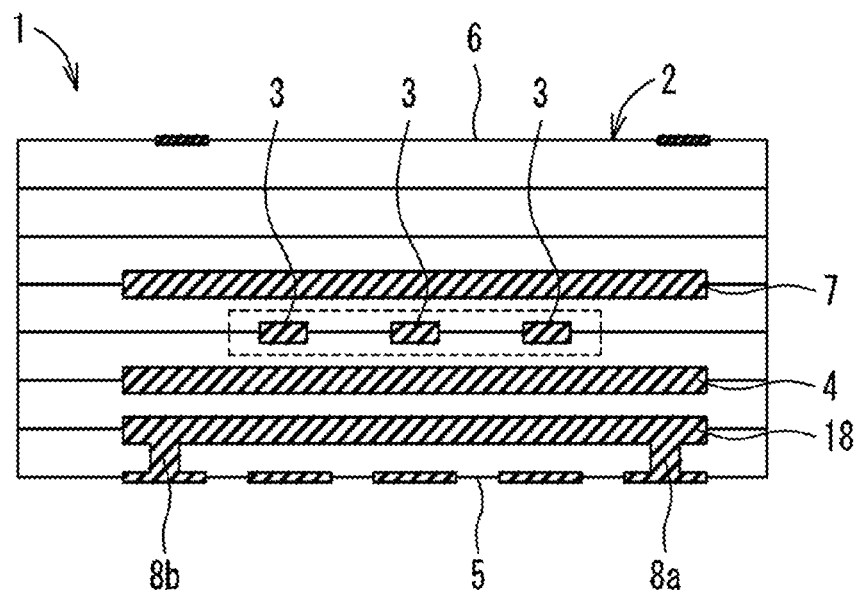
FIG. 12 is a vertical sectional view showing the internal configuration in another example of the ceramic circuit board according to the fifth embodiment.
Figure 13:
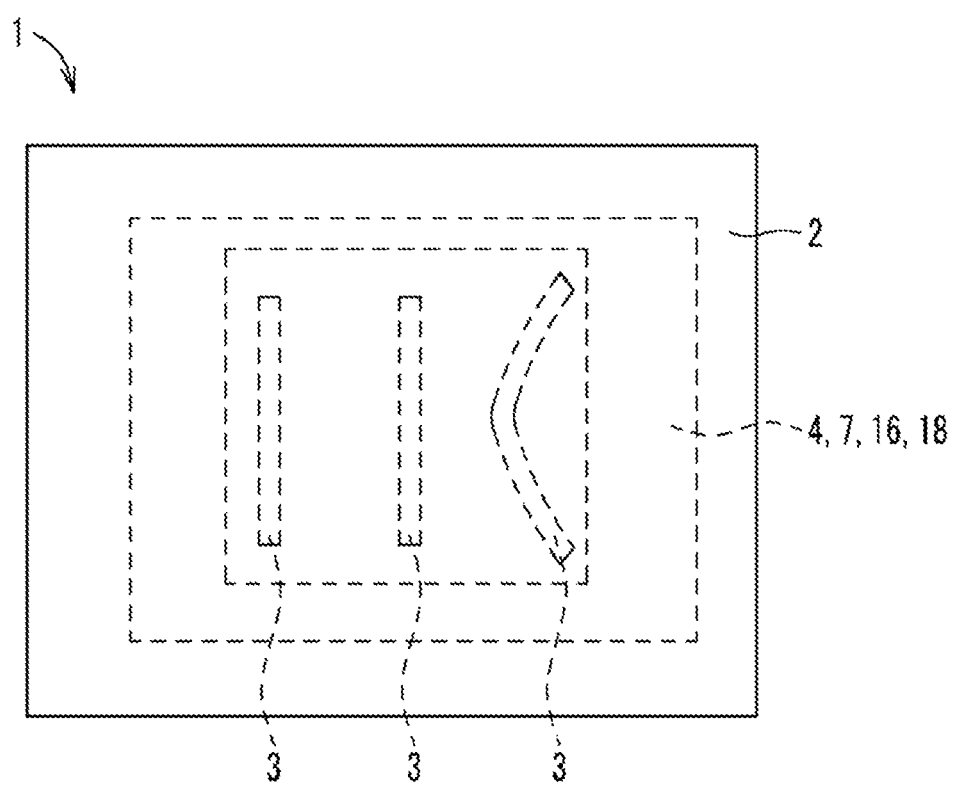
FIG. 13 is a plan view of the ceramic circuit board according to the fifth embodiment.

FIGS. 11 and 12 are vertical sectional views showing the internal configurations of a circuit board 1 according to a fifth embodiment. FIG. 13 is a plan view of FIG. 11 and FIG. 12. The same elements as those in the first embodiment to the fourth embodiment are indicated by the same reference numerals as those set forth above and explanations thereof are not repeated. In the present embodiment, a plurality of metal layers 4, 7, 16, and 18 is disposed in line in the stacking direction such that some are located nearer than the internal leads 3 to the surface 5 or some are located nearer than the internal leads 3 to the surface 6.

The metal layers 7 and 16 located nearer than the internal leads 3 to the surface 6 are heated after the internal leads 3 are heated and, therefore, diffusion of Cu from the metal layers 7 and 16 into the insulating substrate 2 is started in the state in which diffusion of Cu from the internal leads 3 into part of the insulating substrate 2 proceeds. In this regard, as shown in FIG. 11, the metal layers 7 and 16 are disposed, in line in the stacking direction, nearer than the internal leads 3 to the surface 6 and, thereby, the amount of Cu diffusion from the surface 6 side can be increased compared with that from the internal leads 3.

A plurality of metal layers 4 and 18 is embedded, in line in the stacking direction, nearer than the internal leads 3 to the surface 5 and, thereby, diffusion of Cu from the internal leads into the insulating substrate 2 is started in the state in which diffusion of Cu from the plurality of metal layers 4 and 18 proceeds. Consequently, diffusion of Cu from the internal leads 3 can be further suppressed.

As described above, an increase in the electrical resistance of the internal leads 3 can be effectively suppressed by increasing the amount of Cu diffusion from the plurality of metal layers disposed in line in the stacking direction toward the internal leads 3 so as to suppress Cu diffusion from the internal leads 3 in the stacking direction.

Figure 14:
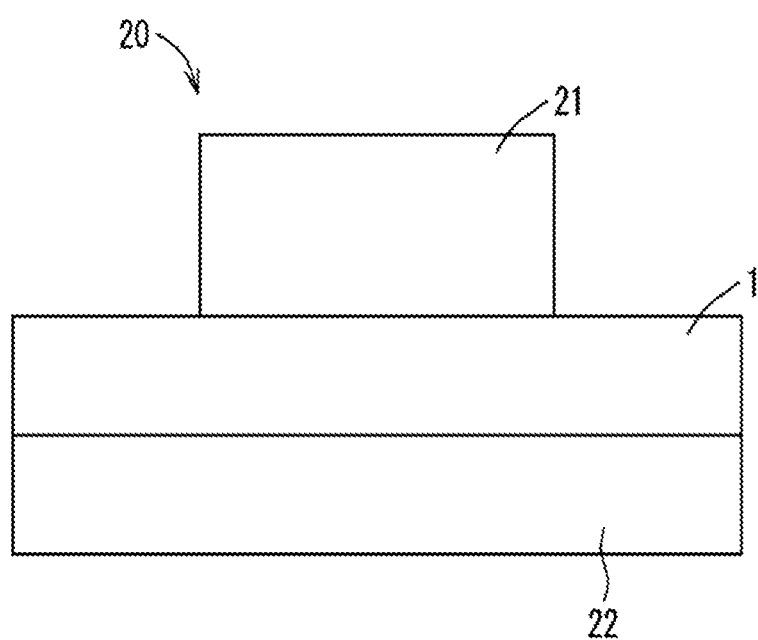
FIG. 14 is a schematic configuration diagram of an electronic device including the ceramic circuit board according to the present invention.

FIG. 14 is a schematic configuration diagram of an electronic device 20 including the circuit board 1 according to the present invention. The electronic device 20 includes an electronic component 21 and a circuit board 1 on which the electronic component 21 is mounted. Further, an organic circuit board 22, on which the circuit board 1 is disposed, may be included. The electronic device 20 includes the circuit board 1 and, thereby, can be made into an electronic device 20 provided with a circuit board 1 not having high electrical resistance.

What is claimed is:

1. A ceramic circuit board comprising:
   an insulating substrate comprising stacked insulating layers of an alumina-based sintered body;
   internal leads comprising Cu and W embedded in the insulating substrate;
   one or a plurality of metal layers comprising Cu embedded in the insulating substrate, at least one of the metal layers being located nearer than the internal leads to a surface of the insulating substrate in a stacking direction which is orthogonal to the surface of the insulating substrate; and
   a through conductor connected to the at least one metal layer, the through conductor being embedded in the insulating substrate and passing through the insulating layers in the stacking direction,
   wherein at least part of the at least one metal layer overlaps the internal leads in a plan view, and the internal leads are not connected to the metal layer and the through conductor.

2. The ceramic circuit board according to claim 1, wherein the ceramic circuit board comprises the plurality of metal layers and two of the plurality of metal layers are disposed on both sides of the internal leads in the stacking direction and the internal leads are interposed between the two metal layers.

3. The ceramic circuit board according to claim 1, wherein the ceramic circuit board comprises the plurality of metal layers and the plurality of metal layers is disposed in line in the stacking direction.

4. The ceramic circuit board according to claim 1, wherein the ceramic circuit board comprises the plurality of metal layers and the plurality of metal layers are adjacent to the internal leads and are disposed in a direction orthogonal to the stacking direction.

5. An electronic device comprising:
   the ceramic circuit board according to claim 1; and
   an electronic component mounted on the ceramic circuit board.

6. The ceramic circuit board according to claim 2, comprising the through conductor connected to the metal layer, wherein the through conductor is embedded in the insulating substrate and passes through the insulating layers in the stacking direction.

7. The ceramic circuit board according to claim 2, wherein the ceramic circuit board comprises the plurality of metal layers and the plurality of metal layers is disposed in line in the stacking direction.

8. The ceramic circuit board according to claim 2, wherein the ceramic circuit board comprises the plurality of metal layers and the plurality of metal layers adjacent to the internal leads are disposed in the direction orthogonal to the stacking direction.

9. The ceramic circuit board according to claim 3,
wherein the ceramic circuit board comprises the plurality of metal layers and the plurality of metal layers adjacent to the internal leads are disposed in a direction orthogonal to the stacking direction.

10. An electronic device comprising:
the ceramic circuit board according to claim 2; and
an electronic component mounted on the ceramic circuit board.

11. An electronic device comprising:
the ceramic circuit board according to claim 3; and
an electronic component mounted on the ceramic circuit board.

12. An electronic device comprising:
the ceramic circuit board according to claim 4; and
an electronic component mounted on the ceramic circuit board.

* * * * *